United States Patent
Bouche et al.

(10) Patent No.: US 7,391,142 B2
(45) Date of Patent: Jun. 24, 2008

(54) ACOUSTIC RESONATOR SUPPORT, ACOUSTIC RESONATOR AND CORRESPONDING INTEGRATED CIRCUIT

(75) Inventors: Guillaume Bouche, Grenoble (FR); Gregory Caruyer, Goncelin (FR); Pascal Ancey, Revel (FR)

(73) Assignee: STMicroelectronics S.A., Montrouge (FR)

( * ) Notice: Subject to any disclaimer, the term of this patent is extended or adjusted under 35 U.S.C. 154(b) by 88 days.

(21) Appl. No.: 10/537,283

(22) PCT Filed: Nov. 27, 2003

(86) PCT No.: PCT/FR03/03500

§ 371 (c)(1), (2), (4) Date: Oct. 18, 2005

(87) PCT Pub. No.: WO2004/051848

PCT Pub. Date: Jun. 17, 2004

(65) Prior Publication Data

US 2006/0226736 A1    Oct. 12, 2006

(30) Foreign Application Priority Data

Nov. 28, 2002    (FR) .................................. 02 14967

(51) Int. Cl.
*H01L 41/08* (2006.01)
(52) U.S. Cl. ...................................................... 310/327
(58) Field of Classification Search .................. 310/327
See application file for complete search history.

(56) References Cited

U.S. PATENT DOCUMENTS

| | | | |
|---|---|---|---|
| 3,422,371 A | | 1/1969 | Poirier et al. |
| 4,651,411 A | * | 3/1987 | Konaka et al. .............. 438/296 |
| 5,873,154 A | | 2/1999 | Ylilammi |
| 6,670,866 B2 | | 12/2003 | Ella et al. |
| 6,720,844 B1 | | 4/2004 | Lakin |
| 6,744,090 B2 | | 6/2004 | Kim |
| 2001/0028285 A1 | | 10/2001 | Klee et al. |
| 2002/0172766 A1 | * | 11/2002 | Laxman et al. ......... 427/255.28 |
| 2004/0253828 A1 | * | 12/2004 | Ozawa et al. ................ 438/710 |
| 2005/0023931 A1 | * | 2/2005 | Bouche et al. .............. 310/327 |
| 2005/0023932 A1 | * | 2/2005 | Inoue et al. ................. 310/327 |
| 2005/0093399 A1 | * | 5/2005 | Inoue ......................... 310/327 |
| 2005/0168104 A1 | * | 8/2005 | Bouche et al. .............. 310/324 |
| 2007/0152777 A1 | * | 7/2007 | Bouche et al. .............. 333/187 |

FOREIGN PATENT DOCUMENTS

| | | | |
|---|---|---|---|
| EP | 1158671 | | 11/2001 |
| JP | 02-101617 | * | 4/1990 |
| JP | 9-275323 | * | 10/1997 |
| JP | 2000353702 A | * | 3/2000 |

OTHER PUBLICATIONS

International Search Report, PCT/FR03/03500, dated May 19, 2004.

* cited by examiner

*Primary Examiner*—Thomas M Dougherty
(74) *Attorney, Agent, or Firm*—Gardere Wynne Sewell LLP

(57) ABSTRACT

A support 7 for an acoustic resonator 4 includes at least one bilayer assembly having a layer of high acoustic impedance material 11 and a layer of low acoustic impedance material 12 made of material having a low electrical permittivity.

19 Claims, 2 Drawing Sheets

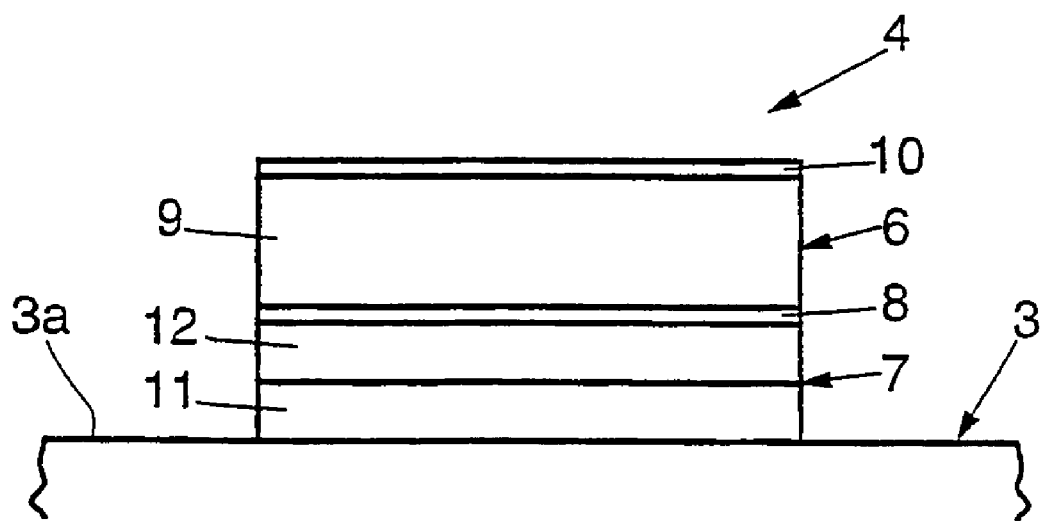

ACOUSTIC RESONATOR SUPPORT, ACOUSTIC RESONATOR AND CORRESPONDING INTEGRATED CIRCUIT

PRIORITY CLAIM

The present application is a 35 U.S.C. 371 filing of PCT/FR2003/003500 which is an international filing of French Application for Patent No. 02 14967 filed Nov. 28, 2002, the disclosures of which are hereby incorporated by reference.

BACKGROUND OF THE INVENTION

1. Technical Field of the Invention

The present invention relates to the field of integrated circuits, and more particularly to integrated circuits comprising one or more acoustic or piezoelectric resonators. Such circuits can be used in signal processing applications, for example, for performing a filtering function.

2. Description of Related Art

Acoustic resonators are integral with the integrated circuit, while having to be acoustically or mechanically isolated therefrom. For this purpose, a support capable of producing such isolation may be provided. The support may comprise an alternation of a layer having a high acoustic impedance and a layer having a low acoustic impedance (see, U.S. Pat. No. 6,081,171, the disclosure of which is hereby incorporated by reference).

The term "acoustic impedance" is understood to mean the quantity Z given by the density $\rho$ of the material multiplied by the acoustic velocity v, i.e., $Z=\rho v$. The acoustic velocity v may be taken as being defined by:

$$v=(\rho C_{33})^{1/2}$$

where $C_{33}$ is one of the coefficients of the elastic compliance matrix.

For high acoustic isolation performance, it is desirable for the difference in acoustic impedance between the materials to be as high as possible.

A need exists in the art to meet this requirement.

SUMMARY OF THE INVENTION

The invention proposes a support for an acoustic resonator, providing a high level of acoustic isolation.

The support for an acoustic resonator, according to one aspect of the invention, comprises at least one bilayer assembly comprising a layer of high-acoustic-impedance material and a layer of low-acoustic-impedance material made of a low-electrical-permittivity material. It appears in fact that low electrical permittivity goes hand in hand with low acoustic impedance. In such a material, an acoustic wave propagates slowly.

Advantageously, the relative electrical permittivity of the low-acoustic-impedance material is less than 4, preferably less than 3 and better still less than 2.5.

Advantageously, the layer of low-acoustic-impedance material is produced from one of the materials used for fabricating the rest of the circuit of which it forms a part, for example, for fabricating the interconnect levels.

In one embodiment, the low-acoustic-impedance material comprises SiOC. SiOC is a material used sometimes for producing dielectric layers having a very low permittivity on a substrate or in the interconnects. Preferably, porous SiOC may be used, the acoustic impedance of which is even lower. The pores of such a material are generally filled with a gas, such as argon.

In a preferred embodiment of the invention, the support comprises a single bilayer assembly. The support is thus particularly compact and economic. In another embodiment of the invention, it is possible to provide a support with two bilayer assemblies, ensuring excellent acoustic isolation while remaining more compact and economic than the known supports that in general comprise at least three bilayer assemblies. However, if the support according to the invention comprises three or more bilayer assemblies, the acoustic isolation characteristics will be very substantially improved for constant compactness.

In one embodiment of the invention, the high-acoustic-impedance material comprises at least one of the following species: aluminum nitride, copper, nickel, tungsten, gold, platinum, molybdenum. Aluminum nitride may be present in its amorphous form and may be advantageous as it is often used to produce other layers of the circuit. Copper has an acoustic impedance lower than that of tungsten, but is beneficial as it is often used in the interconnects of the circuit. A copper layer on the support may thus be produced during a common step for fabricating interconnects. Tungsten offers a particularly high acoustic impedance.

In one embodiment of the invention, the layer of high-acoustic-impedance material has a thickness of between 0.3 and 3.2 μm.

In one embodiment of the invention, the layer of low-acoustic-impedance material has a thickness of between 0.3 and 0.7 μm.

The invention also proposes an acoustic resonator comprising an active element and a support. The support comprises at least one bilayer assembly comprising a layer of high-acoustic-impedance material and a layer of low-acoustic-impedance material made of a low-electrical-permittivity material.

In one embodiment of the invention, the active element comprises at least one piezoelectric layer placed between two electrodes. A lower electrode may rest on the support. The piezoelectric layer may be made of crystalline aluminium nitride. The support acts as interface between the active element and the rest of a circuit.

The invention also proposes an integrated circuit comprising a substrate, a set of interconnects and an acoustic resonator that is provided with an active element and with a support. The support comprises at least one bilayer assembly comprising a layer of high-acoustic-impedance material and a layer of low-acoustic-impedance material made of a low-electrical-permittivity material.

In one embodiment of the invention, the acoustic resonator is placed on the set of interconnects, for example being supported by an upper dielectric layer of the set of interconnects.

In another embodiment of the. invention, the acoustic resonator is placed near the set of interconnects, the upper electrode of the active element of the acoustic resonator possibly being flush with the upper surface of the set of interconnects.

Advantageously, at least one material is common between the support and the substrate or the set of interconnects. Copper may serve both as the layer of high-acoustic-impedance material of the support and for the metallization lines of the set of interconnects. Preferably, a common fabrication step will be provided both for the said layer of high-acoustic-impedance material of the support and the metallization levels of the set of interconnects.

A layer of low-acoustic-impedance material may be placed at the same level as an interconnect layer.

BRIEF DESCRIPTION OF THE DRAWINGS

A more complete understanding of the method and apparatus of the present invention may be acquired by reference to the following Detailed Description when taken in conjunction with the accompanying Drawings wherein:

FIG. 3 is a schematic view of an acoustic resonator according to one aspect of the invention.

DETAILED DESCRIPTION OF THE DRAWINGS

Figure 1:
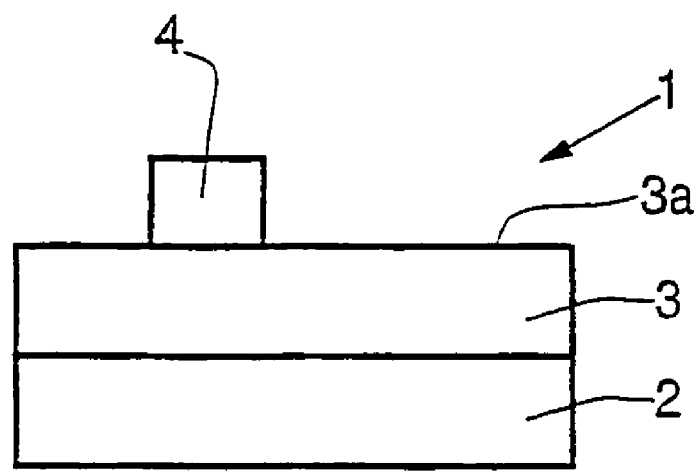
FIG. 1 is a schematic view of an integrated circuit according to a first embodiment of the invention.

As may be seen in FIG. 1, an integrated circuit 1 comprises a substrate 2, in which active zones (not shown) are generally formed, and a set of interconnects 3 placed above the substrate 2 and in contact with its upper surface, and provided with at least one metallization level allowing interconnects to be made between the elements of the substrate.

The integrated circuit 1 is completed by a mechanical acoustic resonator 4 placed above the set of interconnects 3 in contact with its upper surface 3a. The mechanical acoustic resonator 4 supported by the set of interconnects 3 will also be provided with electrical connections (not shown).

Figure 2:
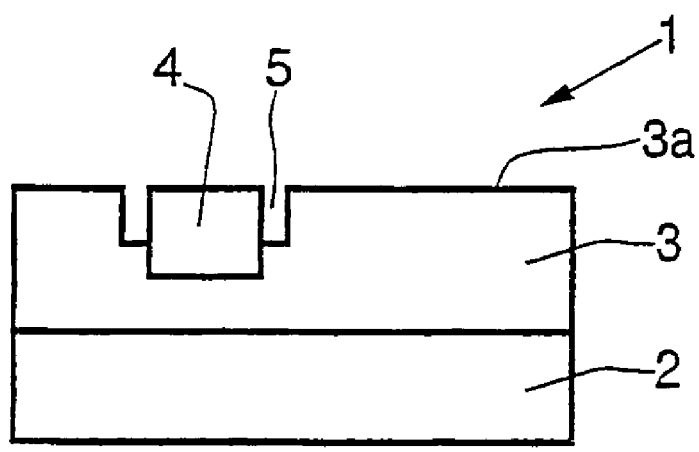
FIG. 2 is a schematic view of an integrated circuit according to a second embodiment of the invention.

In the embodiment illustrated in FIG. 2, the acoustic resonator 4 is placed within the set of interconnects 3 and is flush with its upper surface 3a. This construction makes the integrated circuit 1 more compact. A lower portion of the acoustic resonator 4 may be embodied in the set of interconnects 3, while an upper portion will be left free so as to be able to vibrate, being separated from the rest of the set of interconnects 3 via a groove 5. The groove 5 ensures that the component is isolated in the lateral directions, that is to say it allows the layers to vibrate without direct interference with the substrate. The thickness of the groove 5 may be small, for example less than 1 µm.

The structure of the acoustic resonator 4 will be described will be described in greater detail with reference to FIG. 3.

The acoustic resonator 4 comprises an active element 6 and a support 7 that rests on the upper surface 3a of the set of interconnects 3 and supports the active element 6.

The active element 6 comprises three main layers in the form of a lower electrode 8, a piezoelectric layer 9 and an upper electrode 10. The electrodes 8 and 10 are electrically connected (not shown) to conductors provided in the set of interconnects 3. The electrodes 8 and 10 are made of conducting material, for example aluminum, copper, platinum, molybdenum, nickel, titanium, niobium, silver, gold, tantalum, lanthanum, etc. The piezoelectric layer 9 placed between the electrodes 8 and 10 may be made, for example, of crystalline aluminum nitride, zinc oxide, zinc sulphide, a ceramic of the LiTaO, PbTiO, PbZrTi, KNbO$_3$ type, or else a ceramic containing lanthanum, etc.

The piezoelectric layer 9 may have a thickness of a few µm, for example, 2.4 µm. The electrodes 8 and 10 may have a thickness substantially smaller than the piezoelectric layer 9, for example, 0.1 µm.

The support 7 comprises a high-acoustic-impedance layer 11 resting on the upper surface 3a of the set of interconnects 3 and a low-acoustic-impedance layer 12 that supports the lower electrode 8.

The high-acoustic-impedance layer 11 may be made of a dense material, such as amorphous aluminum nitride, copper, nickel, tungsten, gold or molybdenum. Alloys or superpositions of sublayers of these species may be envisaged. Tungsten offers an extremely high acoustic impedance and may be obtained so as to avoid the residual fabrication constraints, especially in a xenon environment, for example, by a xenon plasma. Copper offers less favorable acoustic impedance characteristics than tungsten, but has the advantage of often being used in the sets of interconnects for forming the conducting lines. Its use in the high-acoustic-impedance layer 11 may allow the said layer 11 to be produced by the same fabrication step as that for the conducting line of the set of interconnects, which is particularly economic.

The low-acoustic-impedance layer is made of a material having a low electrical permittivity, because of the correspondence between low electrical permittivity and low acoustic impedance. The permittivity of the material of the layer 12 is less than 4. However, it will be preferred to use a material having a permittivity of less than 3, for example, a dielectric having a permittivity of around 2.9, often used as dielectric layer in the active zones of the substrate or in the set of interconnects 3. Here again, the same fabrication step may be used to form the layer 12 and a dielectric layer of the set of interconnects 3. For example, SiOC or an SiOC-based material may be used. It is even more advantageous to make the layer 12 from a material having an ultralow permittivity of less than 2.5, for example around 2.0. For this purpose, the layer 12 may be made of porous SiOC or may be based on such a material.

It will be understood that it is particularly advantageous from an economic standpoint to produce the support 7 from chemical species used for the fabrication of the set of interconnects. It is then possible to profit from the fabrication steps for the said set of interconnects in order to produce the support 7. This therefore avoids additional steps and a longer fabrication process.

Since the low-acoustic-impedance material of the layer 12 offers a very large acoustic impedance difference relative to that of the layer 11, the acoustic and/or mechanical isolation provided by the layer 7 between the active element 6 and the rest of the integrated circuit is improved. As a result, it is possible to reduce the number of pairs of layers 11 and 12 of the layer 7 for the same isolation characteristics. Thus, an application conventionally requiring three or four pairs of layers may be produced with only one or two pairs of layers 11 and 12, hence making the acoustic resonator more compact and reducing the costs. FIG. 3 shows a support 7 with one pair of layers 11 and 12. However, it is possible to provide a support 7 with two superposed pairs of layers 11 and 12, or even three or more pairs of layers 11 and 12, which then gives acoustic isolation characteristics of very high level.

It should be noted that a reflector may comprise an odd number of layers if a first layer of low acoustic impedance is placed under one or more bilayers.

The thickness of the low-acoustic-impedance layer 12 depends on the resonant frequency of the active element 6 and could advantageously be around one quarter of the wavelength. The layer 12 may have a thickness of the order of a few tenths of a micron, preferably less than 0.7 µm, for example from 0.2 µm to 0.7 µm. The thickness of the high-acoustic-impedance layer 11 may be of the order of a few tenths of a micron, for example 0.3 µm to 3.2 µm.

The invention therefore offers a support for an acoustic resonator having a very high acoustic impedance of between $30 \times 10^{-6}$ and $130 \times 10^{-6}$ kg/m$^2$·s. It is thus possible to benefit from an acoustic resonator, and from an integrated circuit, that is more compact and more economic because of the reduction in the number of layers.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

The invention claimed is:

1. A support for an acoustic resonator, comprising:
   at least one bilayer assembly supporting an overlying acoustic resonator, comprising:
   a layer of high acoustic impedance material; and
   a layer of low acoustic impedance material made of a low electrical permittivity material, wherein the low acoustic impedance material comprises SiOC;
   wherein the layer of low acoustic impedance material has a thickness of less than 0.7 µm, preferably between 0.3 and 0.7 µm.

2. The support according to claim 1, wherein the electrical permittivity of the low acoustic impedance material is less than about 4.

3. The support according to claim 2, wherein the relative electrical permittivity of the low acoustic impedance material is less than about 2.5.

4. The support according to claim 1, wherein the low acoustic impedance material comprises porous SiOC.

5. The support according to claim 1, wherein it comprises no more than two bilayer assemblies.

6. The support according to claim 1, wherein the electrical permittivity of the low-acoustic-impedance material is less than about 3.

7. A support for an acoustic resonator, comprising:
   at least one bilayer assembly supporting an overlying acoustic resonator, comprising:
   a layer of high acoustic impedance material; and
   a layer of low acoustic impedance material made of a low electrical permittivity material, wherein the low acoustic impedance material comprises SiOC;
   wherein the layer of high acoustic impedance material has a thickness of between 0.3 and 3.2 µm.

8. The support according to claim 7, wherein the high acoustic impedance material comprises at least one material selected from the group consisting of: aluminum nitride, copper, nickel, tungsten, gold, platinum, molybdenum.

9. An acoustic resonator comprising:
   an active element and
   a support having at least one bilayer assembly supporting an overlying active element of the acoustic resonator, comprising:
   a layer of high acoustic impedance material and
   a layer of low acoustic impedance material made of a low electrical permittivity material, wherein the low-acoustic-impedance material comprises a SiOC material;
   wherein the layer of low-acoustic-impedance material has a thickness of between 0.3 and 0.7 µm.

10. The resonator according to claim 9, wherein the active element comprises at least one piezoelectric layer placed between electrodes.

11. The resonator according to claim 9, wherein the electrical permittivity of the low-acoustic-impedance material is less than about 4.

12. The resonator according to claim 9, wherein the support comprises no more than two bilayer assemblies.

13. An acoustic resonator comprising:
   an active element and
   a support having at least one bilayer assembly supporting an overlying active element of the acoustic resonator, comprising:
   a layer of high acoustic impedance material and
   a layer of low acoustic impedance material made of a low electrical permittivity material, wherein the low-acoustic-impedance material comprises a SiOC material;
   wherein the layer of high-acoustic-impedance material has a thickness of between 0.3 and 3.2 µm.

14. The resonator according to claim 13, wherein the high-acoustic-impedance material comprises at least one material selected the group consisting of: aluminum nitride, copper, nickel, tungsten, gold, platinum, molybdenum.

15. An acoustic resonator comprising:
   an active element and
   a support having at least one bilayer assembly supporting an overlying active element of the acoustic resonator, comprising:
   a layer of high acoustic impedance material and
   a layer of low acoustic impedance material made of a low electrical permittivity material, wherein the low-acoustic-impedance material comprises a SiOC material;
   wherein:
   the layer of high acoustic impedance material rests on an interconnect layer of an integrated circuit, the layer of high acoustic impedance material being formed of a conductive material used in making interconnect layers of the integrated circuit; and
   the layer of low acoustic impedance material is formed of an insulating material used in making interconnect layers of the integrated circuit, the layer of low acoustic impedance material resting on the layer of high acoustic impedance material and underlying the active element of the acoustic resonator.

16. The resonator as in claim 15 further comprising a second bilayer assembly resting on the bilayer assembly and underlying the active element of the acoustic resonator.

17. The resonator as in claim 15 further comprising a groove which laterally isolates the acoustic resonator from the interconnect layer of the integrated circuit.

18. The resonator as in claim 15, wherein the interconnect layer of the integrated circuit includes a trench region, the bilayer assembly being positioned within the trench region and embedded in the interconnect layer, with a groove about the acoustic resonator to provide for lateral isolation.

19. The resonator as in claim 15, wherein the layer of high acoustic impedance material is formed of a conductive material used in making the interconnect layer within which the bilayer assembly is embedded, and wherein the layer of low acoustic impedance material is formed of an insulating material used in making the interconnect layer within which the bilayer assembly is embedded.

* * * * *